(12) United States Patent
Jiao et al.

(10) Patent No.: US 12,532,412 B2
(45) Date of Patent: Jan. 20, 2026

(54) METAL ORGANIC FRAMEWORKS (MOFS) FILLER FOR ENABLING LOW CTE AND LOW DIELECTRIC CONSTANT PCB

(71) Applicant: Intel Corporation, Santa Clara, CA (US)

(72) Inventors: Yang Jiao, Chandler, AZ (US); Kyle Davidson, Hillsboro, OR (US); Srinivasa Aravamudhan, Portland, OR (US); Jerry T. Harris, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 791 days.

(21) Appl. No.: 17/703,704

(22) Filed: Mar. 24, 2022

(65) Prior Publication Data

US 2023/0309220 A1 Sep. 28, 2023

(51) Int. Cl.
*H05K 1/00* (2006.01)
*C08J 5/24* (2006.01)
*C08K 5/56* (2006.01)
*H05K 1/03* (2006.01)
*H05K 1/18* (2006.01)

(52) U.S. Cl.
CPC ............ *H05K 1/0373* (2013.01); *C08J 5/244* (2021.05); *C08J 5/249* (2021.05); *C08K 5/56* (2013.01); *H05K 1/0366* (2013.01); *H05K 1/181* (2013.01); *H05K 2201/068* (2013.01); *H05K 2201/10378* (2013.01)

(58) Field of Classification Search
CPC .... H05K 1/0373; H05K 1/0366; H05K 1/181; H05K 2201/068; H05K 2201/10378; C08J 5/249; C08J 5/244; C08K 5/56
See application file for complete search history.

(56) References Cited

U.S. PATENT DOCUMENTS

2022/0322517 A1\* 10/2022 Kim ................. H05K 1/0366

FOREIGN PATENT DOCUMENTS

| DE | 102013220464 A1 | * | 11/2014 | ......... G03F 7/70841 |
| WO | WO-2014166865 A1 | * | 10/2014 | ............... D01F 1/10 |
| WO | WO-2021113415 A1 | * | 6/2021 | .............. C08J 5/249 |

\* cited by examiner

*Primary Examiner* — Pete T Lee
(74) *Attorney, Agent, or Firm* — Schwabe, Williamson & Wyatt P.C.

(57) ABSTRACT

Embodiments disclosed herein include an electronic package. In an embodiment, the electronic package comprises a printed circuit board (PCB), where the PCB comprises a glass weave, a resin, and metal organic frameworks (MOFs) disposed within the resin. In an embodiment, a package substrate is coupled to the PCB, and a die is coupled to the package substrate.

32 Claims, 8 Drawing Sheets

METAL ORGANIC FRAMEWORKS (MOFS) FILLER FOR ENABLING LOW CTE AND LOW DIELECTRIC CONSTANT PCB

TECHNICAL FIELD

Embodiments of the present disclosure relate to electronic packages, and more particularly to electronic packages with printed circuit boards (PCBs) that include metal organic frameworks (MOFs) to enable low coefficient of thermal expansion (CTE) and low dielectric constants.

BACKGROUND

Packaging trends are advancing towards reductions in substrate coefficient of thermal expansion (CTE). For example, advanced package substrates may have a CTE that is 13 ppm/° C. or less. This has the potential to lead to CTE mismatches between the package substrate and the printed circuit board (PCB). For example, existing PCBs typically have a CTE that is 17 ppm/° C., which is a difference of 4 ppm/° C. between the two substrates. This CTE mismatch increases the post surface mount technology (SMT) lid warpage and solder joint stress. This may cause ball grid array (BGA) corner and edge solder joint failure during temperature cycling testing.

The apparent solution to the CTE mismatch between the package substrate and the PCB is to reduce the CTE of the PCB in order to more closely match the CTEs of the package substrate and the PCB. However, this is not without issue. Particularly, decreasing the CTE of the PCB is done by inserting materials that have a low CTE. Generally, low CTE materials have higher dielectric constants. High dielectric constants negatively impact signal integrity at the PCB level.

Accordingly, existing solutions find ways to deal with the CTE mismatch. That is, it is more important to have a low loss laminate for the PCB that can meet high speed I/O (HSIO) requirements. One solution is to increase the number of non-critical-to-function (nCTF) pins at the edges and corners of the BGA. Since the outer pins are nCTF, solder failure due to high stress is not an issue. However, increasing the number of nCTF pins increases the area of the interconnect solution. Another solution is to apply an adhesive to high stress areas (e.g., corners and edges). The use of an adhesive takes more space in the PCB and increases overall manufacturing cost (i.e., material cost, throughput impact, etc.).

EMBODIMENTS OF THE PRESENT DISCLOSURE

Figure 1A:
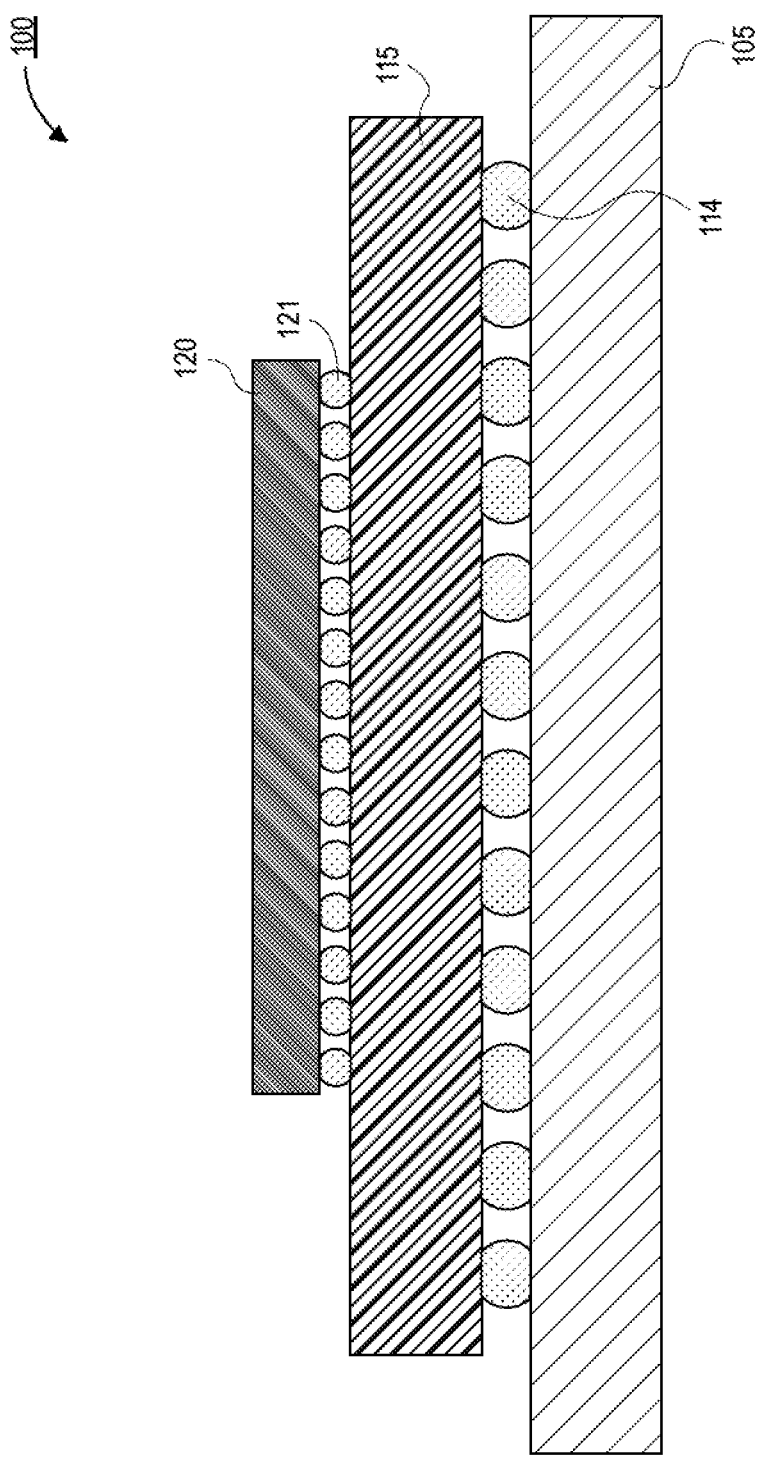
FIG. 1A is a cross-sectional illustration of an electronic system with a printed circuit board (PCB), a package substrate, and a die, where the PCB and the package substrate have non-matching CTEs, in accordance with an embodiment.

Described herein are electronic packages with printed circuit boards (PCBs) that include metal organic frameworks (MOFs) to enable low coefficient of thermal expansion (CTE) and low dielectric constants, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the drive for improved coefficient of thermal expansion (CTE) in the package substrate has resulted in CTE mismatches with the printed circuit board (PCB). Without changing the structure of the PCB, there are some solutions to mitigate stress at the corner pins. For example, additional non-critical-to-function (nCTF) pins may be added to the corners, or an adhesive may be provided along the edge and corner of the interconnect architecture. However, both solutions result in increased footprint and/or increases in cost of manufacture. Accordingly, it is desirable to decrease the CTE of the PCB in order to more closely match the CTE of the package substrate. Unfortunately, existing materials that lead to reductions in CTE also result in an increase in the dielectric constant. The increase in the dielectric constant increases electrical losses along signaling lines, and renders the PCB non-suitable for high speed I/O (HSIO) applications.

Therefore, embodiments disclosed herein include a novel filler component that can be used to decrease CTE of the PCB in addition to maintaining (or even lowering) the dielectric constant of the PCB. Particularly, the novel filler component may be generally classified as metal organic frameworks (MOFs). MOFs include metal clusters that are coupled together by organic ligands. The structure of MOFs provides several benefits.

One benefit is that the MOFs typically have ultra-low dielectric constants (e.g., below approximately 3.0) at high frequencies (e.g., in the terahertz range). In a particular embodiment, the dielectric constant may be between approximately 1.5 and approximately 2.0. This is significantly lower than the dielectric constant of glass fibers and other composites (which typically have dielectric constants between approximately 3.6 and approximately 3.8). Accordingly, the dielectric constant of the PCB may be kept below approximately 3.5 in some embodiments. As used herein, "approximately" may refer to a value that is within ten percent of the stated value. For example, approximately 1.0 may refer to a value that is between 0.90 and 1.10.

Another benefit of MOF fillers is due to the nature of their high porosity. The high porosity results in a negative CTE value. For example, embodiments may include MOF fillers that have a CTE value of approximately −20 ppm/° C. As such, inclusion of the MOF fillers in the resin of the PCB may result in an overall decrease in the CTE of the PCB. For example, the CTE of the PCB may be reduced in order to match the CTE of advanced package substrate architectures (e.g., approximately 13 ppm/° C. or less).

It is to be appreciated that the structure of the MOF fillers results in an elimination of the tradeoff between low CTE and high dielectric constants exhibited by existing material systems. As such, the use of MOF fillers enables a low CTE PCB that is still suitable for HSIO applications. Furthermore, there is no need for extra nCTF pins or adhesives at the corner and edges of the pins. This allows for a reduction in footprint and tightens the keep-out-zone (KOZ) of the system.

Referring now to FIG. 1A, a cross-sectional illustration of a typical electrical system 100 is shown, in accordance with an embodiment. In an embodiment, the electrical system 100 may include a PCB 105. The PCB 105 may comprise traditional resin and fiber architectures. For example, the PCB 105 may include cross-woven glass fibers. Electrical features (e.g., traces, vias, pads, etc.) may be included in the PCB 105, as is common in the art. The electrical features are omitted from FIG. 1A for simplicity.

The PCB 105 may be suitable for HSIO applications. However, as noted above, the tradeoff to enable HSIO application (i.e., low dielectric constant) is that the PCB will have a higher CTE than the overlying package substrate 115. For example, the package substrate 115 may have a CTE of approximately 13 ppm/° C., and the PCB 105 may have a CTE of approximately 17 ppm/° C. As such, the interconnects 114 between the PCB 105 and the package substrate 115 may experience high stress, especially at the corner and edges of the interconnect 114 field. In order to mitigate the high stress, adhesive (not shown) may be applied to the corners of the interconnect 114 field, or additional nCTFs may be provided at the corners.

In an embodiment, the electronic system 100 may further comprise a die 120 that is coupled to the package substrate 115. For example, first level interconnects (FLIs) 121 may couple the die 120 to the package substrate 115. While shown as solder balls, it is to be appreciated that the FLIs 121 may include any suitable interconnect architecture. Additionally, while a single die 120 is shown in FIG. 1A, it is to be appreciated that multi-die interconnect architectures may also be used in accordance with additional embodiments. For example, a pair of dies 120 may be adjacent to each other on the package substrate 115. In other embodiments, multi-die 120 stacks may be provided. In an embodiment, the die 120 (or dies 120) may include any type (or types) of dies. For example, the die 120 may include a processor, a graphics processor, a memory, or the like. While shown as not having a thermal solution, it is to be appreciated that a thermal solution (e.g., integrated heat spreader (IHS) and/or heatsink) may be thermally coupled to the backside of the die 120.

Figure 1B:
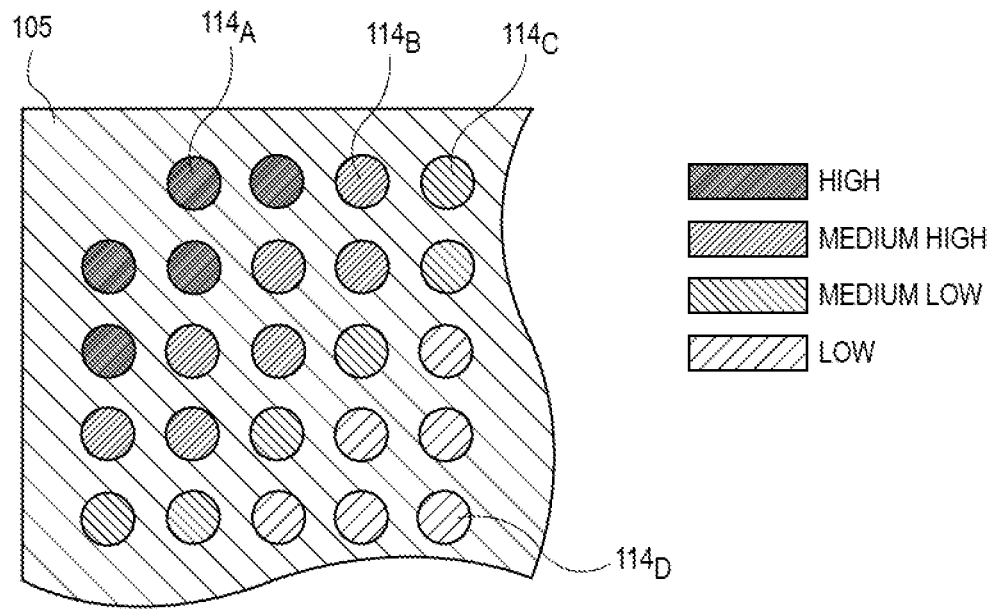
FIG. 1B is a plan view illustration of a corner of the PCB that illustrates the high stress experienced by the corner pins when there is a CTE mismatch between the package substrate and the PCB, in accordance with an embodiment.

Referring now to FIG. 1B, a plan view illustration of a corner of the PCB 105 is shown, in accordance with an embodiment. The PCB 105 may include a bump field or other types of pins 114 that are coupled between the PCB and the overlying package substrate (not shown). In the illustrated embodiment, the pins 114 are shown as solder balls, as an example. The PCB 105 may have a CTE that is greater than the CTE of the overlying package substrate (not shown). Due to the difference in CTE, the interconnects 114 may experience high stresses, especially at the corner regions.

For ease of illustration, each of the interconnects 114 are shaded with a shading that indicates the amount of stress on the interconnect 114. For example, four different stress amounts are shown: 1) high stress; 2) medium high stress; 3) medium low stress; and 4) low stress. While each interconnect 114 is shown with an individual shading, it is to be appreciated that multiple stress levels may be provided on a single interconnect 114. Additionally, while four discrete stress levels are shown for simplicity, it is to be appreciated that there may be a continuous gradient of stress between the high stress and the low stress.

As shown, the corner most interconnects $114_A$ experience high stress.

Accordingly, the corner interconnects $114_A$ are susceptible to cracking or other damage. As such, the corner interconnects $114_A$ may be nCTF interconnects 114, as described above. In an embodiment, interconnects 114B may have medium high stress, interconnects $114_C$ may have medium low stress, and interconnects $114_D$ may have low stress. As illustrated, the further from the corner, the lower the stress.

Figure 2:
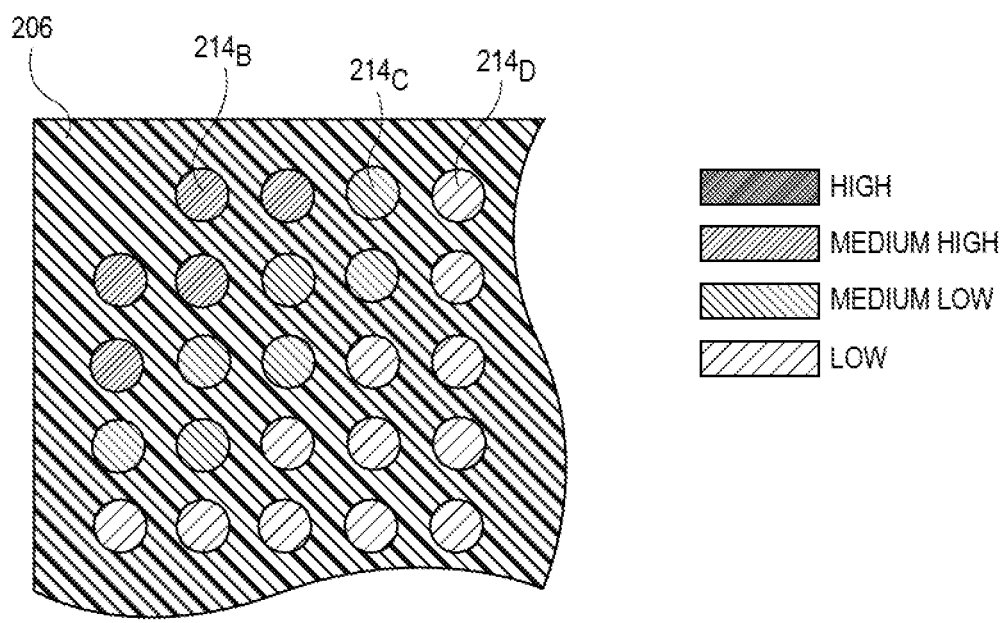
FIG. 2 is a plan view illustration of a corner of the PCB that illustrates reduced stress on the corner pins when the CTE of the package substrate substantially matches the CTE of the PCB, in accordance with an embodiment.

Referring now to FIG. 2, a plan view illustration of a corner of a PCB 206 is shown, in accordance with an embodiment. The PCB 206 may include a bump field or other types of pins 214 that are coupled between the PCB and the overlying package substrate (not shown). In the illustrated embodiment, the pins 214 are shown as solder balls, as an example. The PCB 206 may have a CTE that is substantially equal to the CTE of the overlying package substrate (not shown). The reduction in the CTE of the PCB may be due to the inclusion of MOF fillers (not shown). The benefit of MOF fillers will be described in greater detail below. Due to the similarities in the CTE, the interconnects 214 may experience lower stresses than shown in FIG. 1B, especially at the corner regions.

For ease of illustration, each of the interconnects 214 are shaded with a shading that indicates the amount of stress on the interconnect 214. For example, three different stress amounts are shown: 1) medium high stress; 2) medium low stress; and 3) low stress. While each interconnect 214 is shown with an individual shading, it is to be appreciated that multiple stress levels may be provided on a single interconnect 214. Additionally, while three discrete stress levels are shown for simplicity, it is to be appreciated that there may be a continuous gradient of stress between the medium high stress and the low stress.

As shown, the stresses of the interconnects 214 are generally lower than the stresses of the interconnects 114 in FIG. 1B. This is because the CTE of the PCB 206 more closely matches the CTE of the overlying package substrate. In a particular embodiment, it may be demonstrated that there is a decrease in the stress levels by approximately 20×. For example, interconnects $214_B$ may have medium high stress, interconnects $214_C$ may have medium low stress, and interconnects $214_D$ may have low stress. As such, there is no need for stress reducing architectures such as corner adhesives, or for using nCTF interconnects 214 at the corners.

Figure 3:
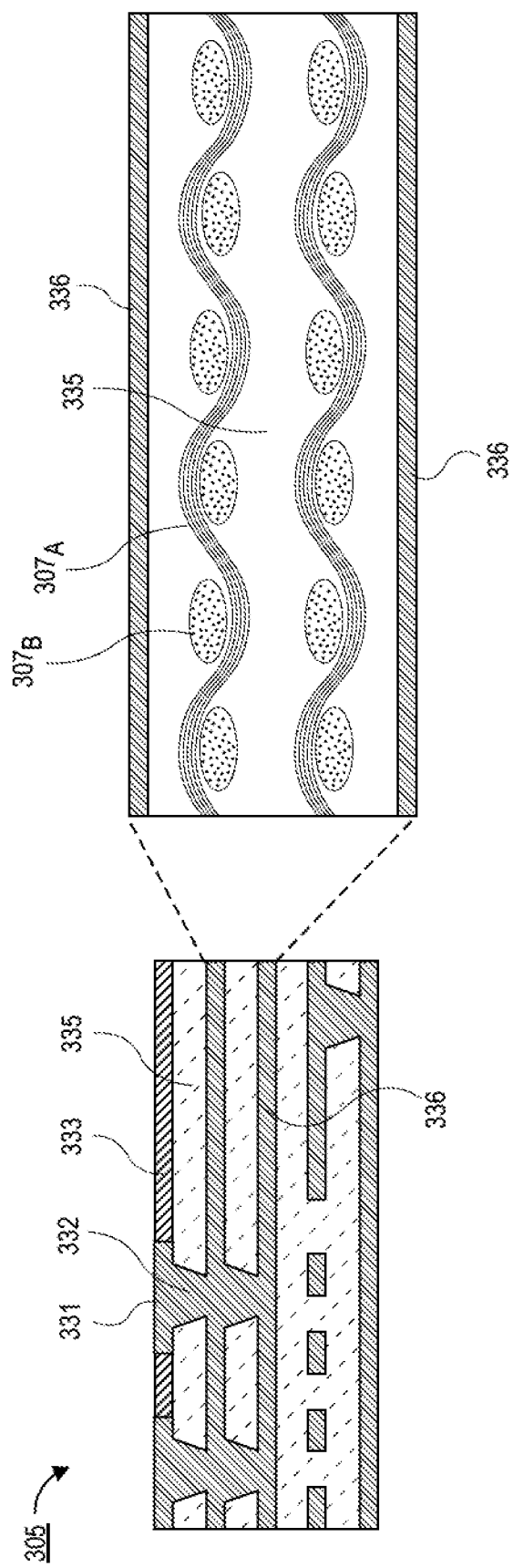
FIG. 3 is a cross-sectional illustration of a PCB that includes a standard resin and woven fiber architecture, in accordance with an embodiment.

Referring now to FIG. 3, a cross-sectional illustration of a PCB 305 is shown, in accordance with an embodiment. In an embodiment, the PCB 305 may be a standard PCB architecture. That is, the PCB 305 may have a CTE that is higher than the CTE of an overlying package substrate (not shown). For example, the PCB 305 may have a CTE that is approximately 17 ppm/° C.

In an embodiment, the PCB 305 may include resin layers 335. Conductive layers 336 may be provided over and/or under the resin layers 335. In an embodiment, vias 332 may provide electrical connections between layers. One or more pads 331 may be provided on the top of the resin layers 335. A solder resist 333 may surround the pads 331.

The enlarged image on the right more clearly depicts the structure of a single resin layer 335. As shown, a resin 335 may include reinforcing fibers 307. For example, the fibers 307 may be glass fibers or any other suitable composite material. In an embodiment, the glass fibers 307 may have a dielectric constant that is between approximately 3.6 and approximately 3.8. In an embodiment, the glass fibers 307 may be provided in a weave pattern, which may be referred to as a glass weave. In the illustrated embodiment, fibers $307_A$ generally lie from left-to-right, and fibers $307_B$ travel into and out of the plane of FIG. 3. In an embodiment, conductive layers 336 (e.g., copper foil) may be provided above and below the resin 335.

As noted above, such a PCB architecture does not closely match the CTE of the overlying package substrate. Accordingly, there is high stress generated at the corner interconnects, which may result in interconnect failures. In some instances the CTE of the PCB may be reduced by including fillers in the resin 335. However, decreasing the CTE of the PCB also results in an increase in the dielectric constant. This makes the PCB non-suitable for HSIO applications.

Therefore, embodiments described herein include MOF fillers that reduce CTE and maintain (or even reduce) the dielectric constant. As such, the PCB architectures disclosed herein are compatible with advanced package substrate architectures while also enabling HSIO applications.

Figure 4:
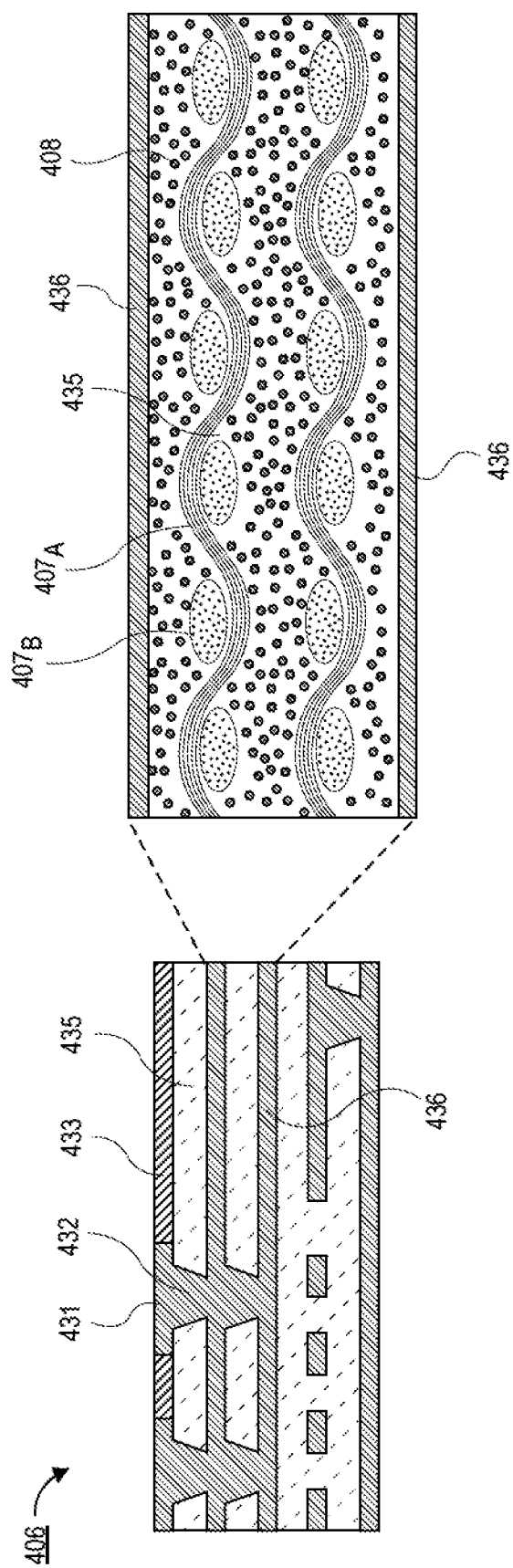
FIG. 4 is a cross-sectional illustration of a PCB that includes a resin and woven fiber architecture with the addition of metal organic frameworks (MOFs) into the resin in order to reduce the CTE and the dielectric constant, in accordance with an embodiment.

An example of such a PCB 406 is shown in FIG. 4. The cross-sectional illustration of a PCB 406 on the left may be similar to the PCB 305 in FIG. 3. For example, the PCB 406 may include resin layers 435. Conductive layers 436 may be provided over and/or under the resin layers 435. In an embodiment, vias 432 may provide electrical connections between layers. One or more pads 431 may be provided on the top of the resin layers 435. A solder resist 433 may surround the pads 431.

In an embodiment, the PCB 406 may have a CTE that is substantially equal to a CTE of an overlying package substrate (not shown). For example, the PCB 406 may have a CTE that is approximately 13 ppm/° C. or less. The reduction in CTE may be the result of MOF fillers that are included in the resin layers 435. The MOF fillers are shown in the zoomed in image of a resin layer 435 on the right.

As shown, a resin 435 may include reinforcing fibers 407. For example, the fibers 407 may be glass fibers or any other suitable composite material. In an embodiment, the glass fibers 407 may have a dielectric constant that is between approximately 3.6 and approximately 3.8. In an embodiment, the glass fibers 407 may be provided in a weave pattern, which may be referred to as a glass weave. In the illustrated embodiment, fibers $407_A$ generally lie from left-to-right, and fibers $407_B$ travel into and out of the plane of FIG. 4. In an embodiment, conductive layers 436 (e.g., copper foil) may be provided above and below the resin 435.

In an embodiment, MOF fillers 408 are provided within the layer of resin 435. The MOF fillers 408 may include a volume percentage that is approximately 60% or less. In a particular embodiment, the volume percentage of the MOF fillers 408 may be between approximately 30% and approximately 60%. In an embodiment, the MOF fillers 408 may have a CTE that is negative. For example, the CTE of the MOF fillers 408 may be approximately −20 ppm/° C. or less. The negative CTE of the MOF fillers 408 may result in an overall decrease in the CTE of the PCB 406 in order to substantially match the CTE of the package substrate. Additionally, the dielectric constant of the MOF fillers 408 may be low as well. For example, the dielectric constant of the MOF fillers 408 may be approximately 3.0 or less, or approximately 2.0 or less.

Figure 5:
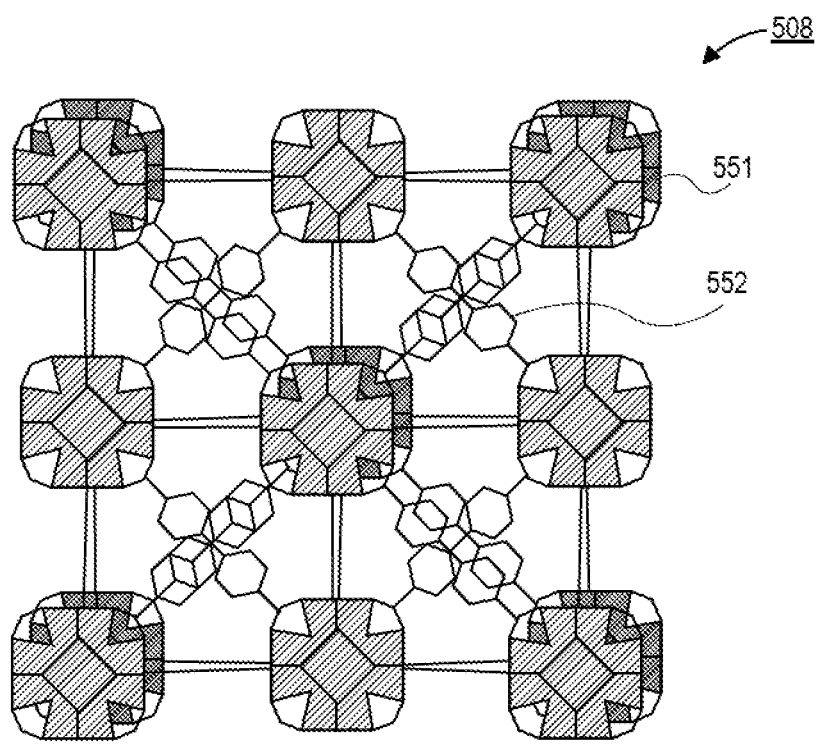
FIG. 5 is a schematic illustration of a MOF, in accordance with an embodiment.

In an embodiment, MOF fillers 408 may be a general class of materials that include metal clusters that are coupled together by organic ligands. An example, of a MOF filler 508 is shown in FIG. 5. As shown, the metal clusters 551 are coupled together by organic ligands 552. In the particular embodiment shown in FIG. 5, a $Zr_6O_4(OH)_4(BPDC)_6$ MOF filler 508 is shown, where BPDC stands for biphenyl dicarboxylic acid. Other types of MOF fillers 508 may also be used, such as zeolitic imidazole framework (ZIF) structures.

It is to be appreciated that the presence of MOF fillers 508 in the resin of the PCBs can be easily detected with material analysis tools. Particularly, the presence of the metal clusters can be detected using processes such as energy-dispersive x-ray (EDX) spectroscopy. For example, the presence of Zr or Hf in the resin may be an indication that MOF fillers 508 have been used to obtain the desirable properties of the PCB.

Figure 6:
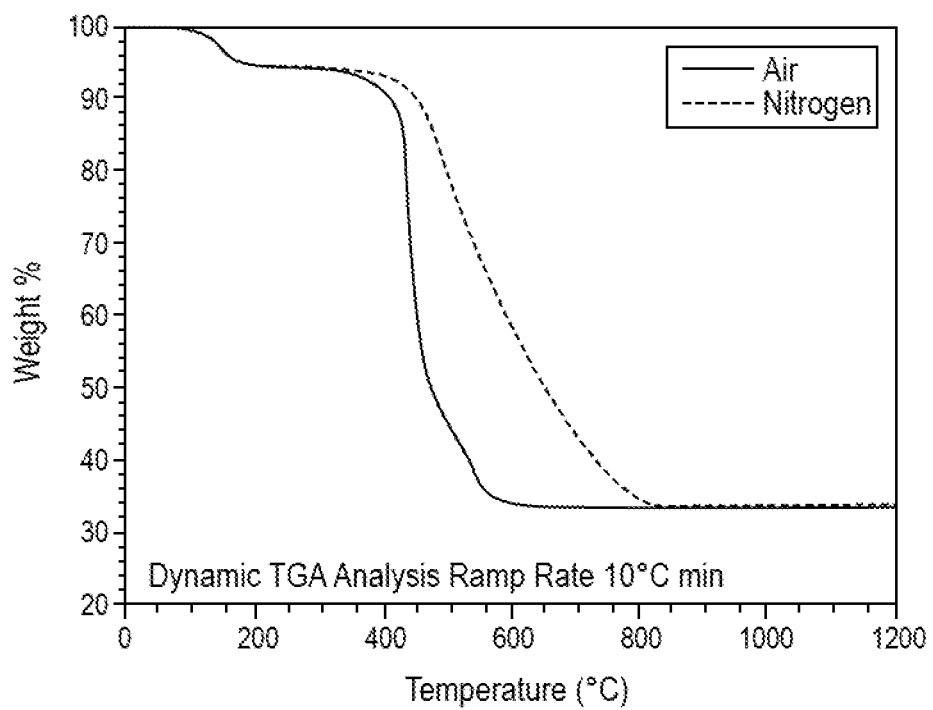
FIG. 6 is a graph that illustrates the decomposition temperature of a typical MOF as being over 450° C., which is higher than the typical use case of the PCB, in accordance with an embodiment.

The highly porous structure of MOF fillers does bring several concerns for materials reliability. However, as will be described herein, the material properties of MOF fillers fully address such concerns. One concern is that the highly porous structure may result in thermal stability concerns. However, as shown in FIG. 6, the thermal performance of MOF fillers is sufficient for temperatures typical of PCB applications. As shown, in oxygen, the thermal performance of MOF fillers is generally stable up until about 450° C. This is significantly higher than the typical temperatures experienced by PCBs (e.g., which are up to approximately 250° C.). Additionally, the structural integrity is good over long periods of time. For example, ZIF type MOF fillers have excellent structural integrity up to 300° C. for 24 hours. Generally, the excellent thermal performance of MOF fillers is provided by high coordinate numbers in the structure. For example, in one class of MOF fillers, hexanuclear Zr/Hf oxyhydroxide clusters are each connected with 12 benzene-1,4-dicarboxylate ligands. That is, the connections between the metal clusters are exceptionally strong given the high porosity of the material.

Figure 7:
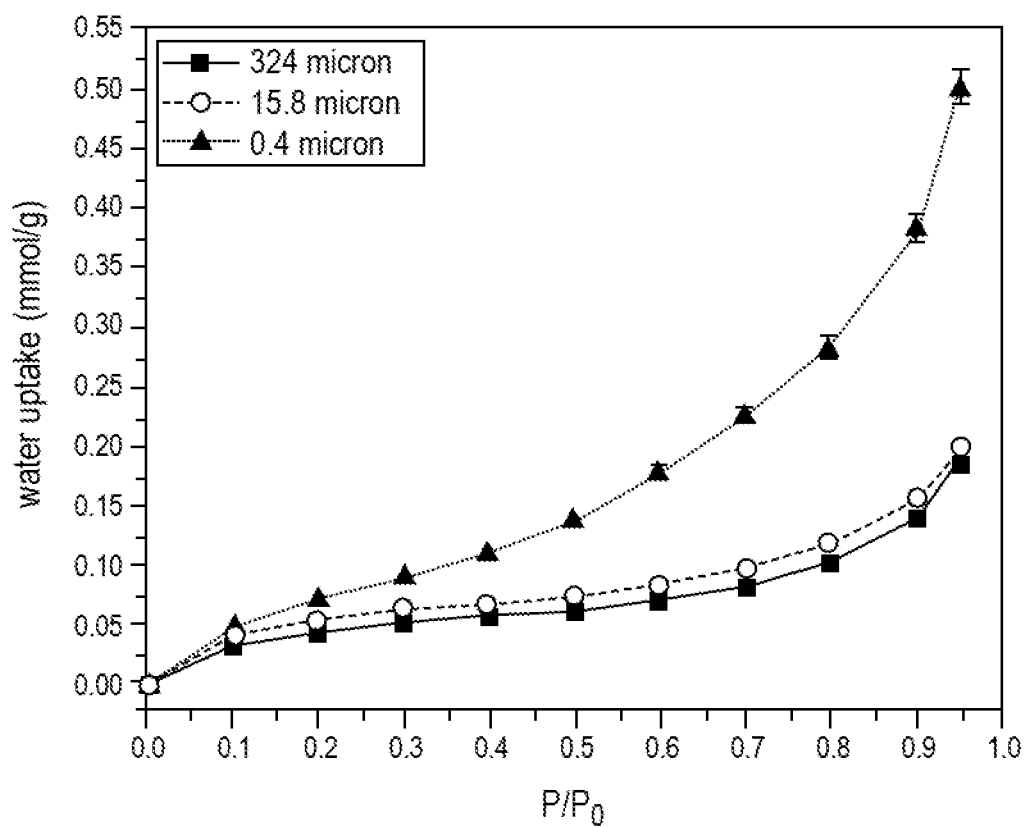
FIG. 7 is a graph of the moisture uptake in the MOFs and illustrates that moisture uptake is not a significant issue in MOF based PCBs, in accordance with an embodiment.

A second concern is the moisture uptake of MOF fillers. The idea being that the porous nature of the MOF fillers provides space for water uptake. However, the MOF fillers generally exhibit a hydrophobic behavior since they are made of organic ligands. As shown in FIG. 7, the moisture uptake may be about 0.9 wt %. Notably, moisture adsorption is an exothermic reaction, so the uptake will be even lower at higher processing temperatures.

Figure 8:
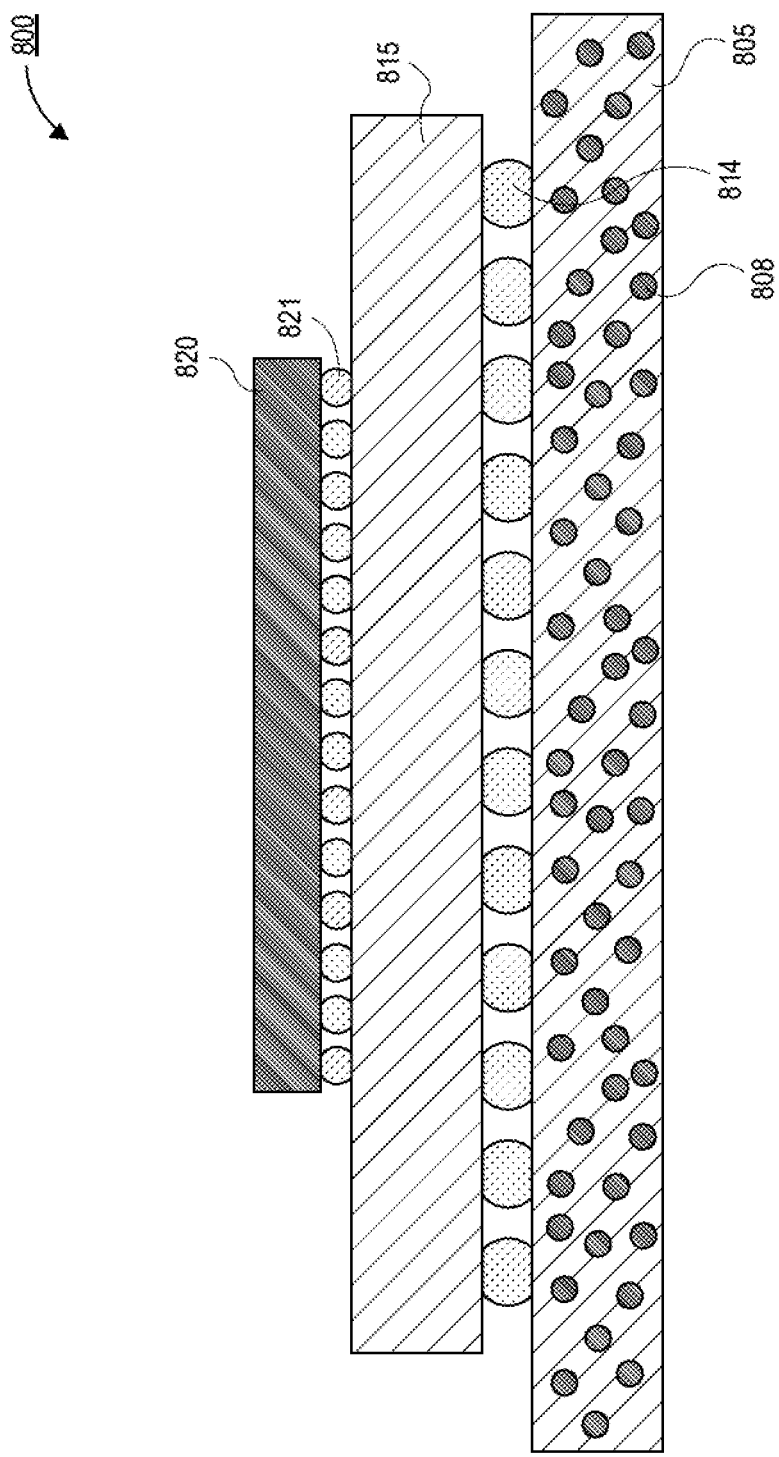
FIG. 8 is a cross-sectional illustration of an electronic system that includes a PCB with MOFs, a package substrate, and a die, in accordance with an embodiment.

Referring now to FIG. 8, a cross-sectional illustration of an electronic system 800 is shown, in accordance with an embodiment. In an embodiment, the electrical system 800 may include a PCB 805. The PCB 805 may comprise traditional resin and fiber architectures with the addition of MOF fillers 808. For example, the PCB 805 may include cross-woven glass fibers and MOF fillers 808 within a resin. The MOF fillers 808 may be similar to any of the MOF fillers described in greater detail above. For example, the MOF fillers 808 may be detected through EDX microscopy via the detection of the metal clusters (e.g., zirconium). Electrical features (e.g., traces, vias, pads, etc.) may be included in the PCB 805, as is common in the art. The electrical features are omitted from FIG. 8 for simplicity.

The PCB 805 may be suitable for HSIO applications. That is, the PCB 805 may have a low dielectric constant. Additionally, the PCB 805 may have a low CTE. For example, the package substrate 815 may have a CTE of approximately 13 ppm/° C., and the PCB 805 may have a CTE of approximately 13 ppm/° C. As such, the interconnects 814 between the PCB 805 and the package substrate 815 may experience relatively low stress. The low CTE and low dielectric constant may be the result of the inclusion of MOF fillers 808, as described in greater detail above.

In an embodiment, the electronic system 800 may further comprise a die 820 that is coupled to the package substrate 815. For example, FLIs 821 may couple the die 820 to the package substrate 815. While shown as solder balls, it is to be appreciated that the FLIs 821 may include any suitable interconnect architecture. Additionally, while a single die 820 is shown in FIG. 8, it is to be appreciated that multi-die interconnect architectures may also be used in accordance with additional embodiments. For example, a pair of dies 820 may be adjacent to each other on the package substrate 815. In other embodiments, multi-die 820 stacks may be provided. In an embodiment, the die 820 (or dies 820) may include any type (or types) of dies. For example, the die 820 may include a processor, a graphics processor, a memory, or the like. While shown as not having a thermal solution, it is to be appreciated that a thermal solution (e.g., IHS and/or heatsink) may be thermally coupled to the backside of the die 820.

Figure 9:
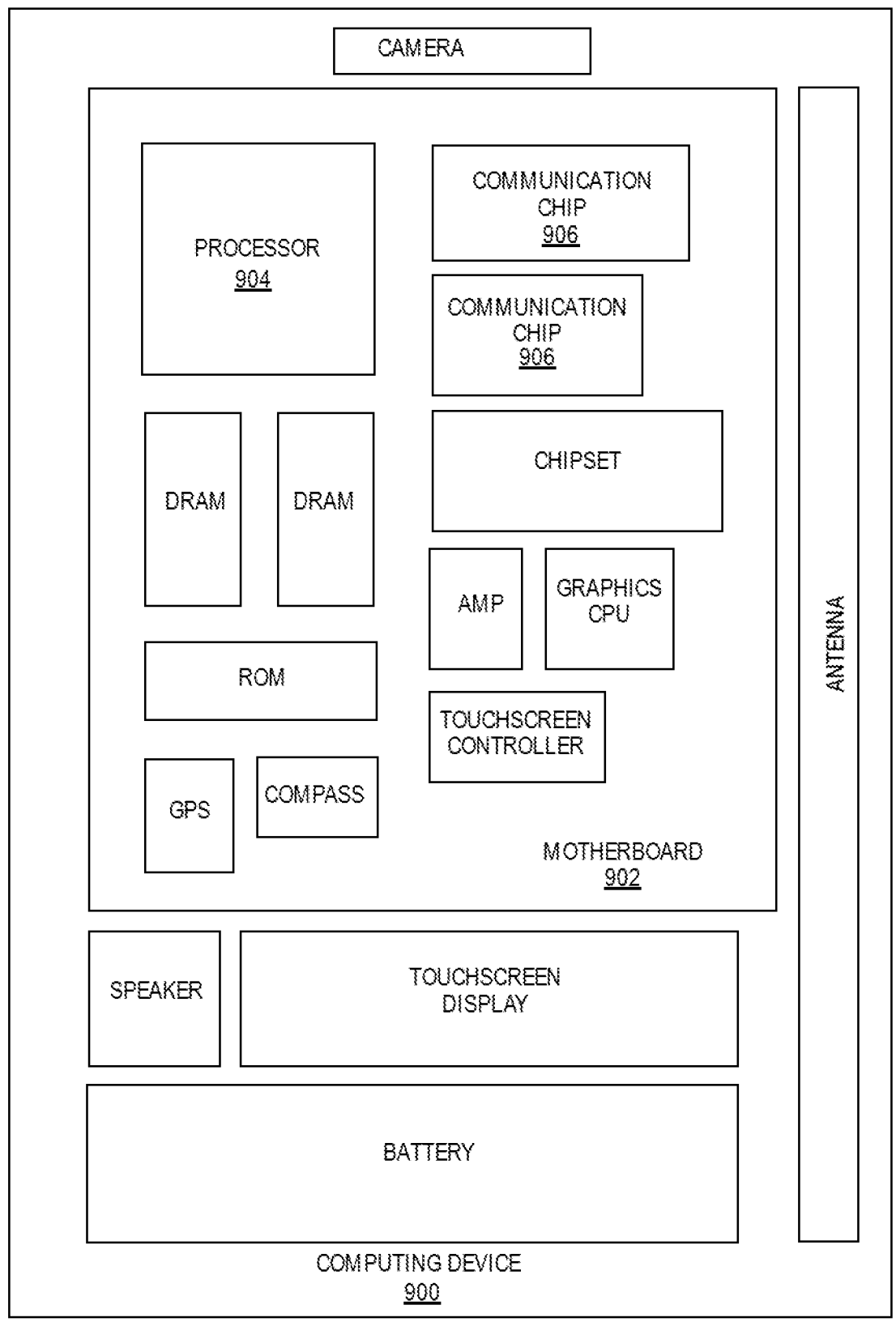
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may part of an electronic package that includes a PCB with MOF fillers in order to reduce the CTE and the dielectric constant, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may part of an electronic package that includes a PCB with MOF fillers in order to reduce the CTE and the dielectric constant, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a printed circuit board (PCB), wherein the PCB comprises: a glass weave; a resin; and metal organic frameworks (MOFs) disposed within the resin; a package substrate coupled to the PCB; and a die coupled to the package substrate.

Example 2: the electronic package of Example 1, wherein the MOFs comprise zirconium.

Example 3: the electronic package of Example 2, wherein the MOFs are $Zr_6O_4(BPDC)_6$, where BPDC is biphenyl dicarboxylic acid.

Example 4: the electronic package of Examples 1-3, wherein a dielectric constant of the PCB is less than approximately 3.5.

Example 5: the electronic package of Example 4, wherein the dielectric constant of the PCB is approximately 2.0 or less.

Example 6: the electronic package of Examples 1-5, wherein a coefficient of thermal expansion (CTE) of the PCB is less than approximately 13.0 ppm/° C.

Example 7: the electronic package of Example 6, wherein the CTE of the PCB is approximately 10 ppm/° C. or less.

Example 8: the electronic package of Examples 1-7, wherein a CTE of the PCB is less than approximately 13.0 ppm/° C., and wherein the dielectric constant of the PCB is approximately 3.5 or less.

Example 9: the electronic package of Example 8, wherein the dielectric constant is measured at a frequency region in the terahertz range.

Example 10: the electronic package of Examples 1-9, wherein a volume percentage of the MOFs in the PCB is approximately 60% or less.

Example 11: the electronic package of Example 10, wherein the volume percentage of the MOFs in the PCB is approximately 30% or less.

Example 12: the electronic package of Examples 1-11, wherein the MOFs are zeolitic imidazole frameworks (ZIFs)

Example 13: the electronic package of Examples 1-12, wherein a CTE of PCB is substantially equal to the CTE of the package substrate.

Example 14: the electronic package of Examples 1-13, wherein a decomposition temperature of the MOFs is at approximately 450° C. or higher.

Example 15: the electronic package of Examples 1-14, wherein a moisture uptake of the MOFs is approximately 1.0 weight % or lower.

Example 16: a printed circuit board (PCB), comprising: glass fibers; and a resin material, wherein the resin material comprises zirconium.

Example 17: the PCB of Example 16, wherein the resin material comprises metal organic frameworks (MOFs).

Example 18: the PCB of Example 17, wherein the MOFs comprise hexanuclear Zr/Hf oxyhydroxide clusters, and wherein each cluster is connected with 12 benzene-1,4-dicarboxylate ligands.

Example 19: the PCB of Example 17 or Example 18, wherein a volume percentage of the MOFs in the PCB is approximately 60% or less.

Example 20: the PCB of Examples 16-19, further comprising: a copper foil over and under the PCB.

Example 21: the PCB of Examples 16-20, wherein a dielectric constant of the PCB is less than approximately 3.5.

Example 22: the PCB of Example 21, wherein the dielectric constant of the PCB is approximately 2.0 or less.

Example 23: the PCB of Examples 16-22, wherein a coefficient of thermal expansion (CTE) of the PCB is less than approximately 10.0 ppm/° C.

Example 24: an electronic system, comprising: a printed circuit board (PCB), wherein the PCB has a first coefficient of thermal expansion (CTE), and wherein the PCB comprises: a glass weave; a resin around the glass weave; and metal organic frameworks (MOFs) in the resin, wherein the MOFs comprise hexanuclear Zr/Hf oxyhydroxide clusters, and wherein each cluster is connected with 12 benzene-1,4-dicarboxylate ligands; a package substrate coupled to the PCB, wherein the package substrate has a second CTE that is substantially equal to the first CTE; and a die coupled to the package substrate.

Example 25: the electronic system of Example 24, wherein a dielectric constant of the PCB in the terahertz range is approximately 3.5 or lower.

What is claimed is:
1. An electronic package, comprising:
   a printed circuit board (PCB), wherein the PCB comprises:
      a glass weave;
      a resin; and
      metal organic frameworks (MOFs) disposed within the resin, wherein the MOFs are $Zr_6O_4(BPDC)_6$, where BPDC is biphenyl dicarboxylic acid;
   a package substrate coupled to the PCB; and
   a die coupled to the package substrate.

2. The electronic package of claim 1, wherein a dielectric constant of the PCB is less than approximately 3.5.

3. The electronic package of claim 2, wherein the dielectric constant of the PCB is approximately 2.0 or less.

4. The electronic package of claim 1, wherein a coefficient of thermal expansion (CTE) of the PCB is less than approximately 13.0 ppm/° C.

5. The electronic package of claim 4, wherein the CTE of the PCB is approximately 10 ppm/° C. or less.

6. The electronic package of claim 1, wherein a CTE of the PCB is less than approximately 13.0 ppm/° C., and wherein the dielectric constant of the PCB is approximately 3.5 or less.

7. The electronic package of claim 6, wherein the dielectric constant is measured at a frequency region in the terahertz range.

8. The electronic package of claim 1, wherein a volume percentage of the MOFs in the PCB is approximately 60% or less.

9. The electronic package of claim 8, wherein the volume percentage of the MOFs in the PCB is approximately 30% or less.

10. The electronic package of claim 1, wherein the MOFs are zeolitic imidazole frameworks (ZIFs).

11. The electronic package of claim 1, wherein a CTE of PCB is substantially equal to the CTE of the package substrate.

12. The electronic package of claim 1, wherein a decomposition temperature of the MOFs is at approximately 450° C. or higher.

13. The electronic package of claim 1, wherein a moisture uptake of the MOFs is approximately 1.0 weight % or lower.

14. A printed circuit board (PCB), comprising:
   glass fibers; and
   a resin material, wherein the resin material comprises zirconium, wherein the resin material comprises metal organic frameworks (MOFs), and wherein the MOFs comprise hexanuclear Zr/Hf oxyhydroxide clusters, and wherein each cluster is connected with 12 benzene-1,4-dicarboxylate ligands.

15. The PCB of claim 14, wherein a volume percentage of the MOFs in the PCB is approximately 60% or less.

16. The PCB of claim 14, further comprising:
   a copper foil over and under the PCB.

17. The PCB of claim 14, wherein a dielectric constant of the PCB is less than approximately 3.5.

18. The PCB of claim 17, wherein the dielectric constant of the PCB is approximately 2.0 or less.

19. The PCB of claim 14, wherein a coefficient of thermal expansion (CTE) of the PCB is less than approximately 10.0 ppm/° C.

20. An electronic system, comprising:
a printed circuit board (PCB), wherein the PCB has a first coefficient of thermal expansion (CTE), and wherein the PCB comprises:
a glass weave;
a resin around the glass weave; and
metal organic frameworks (MOFs) in the resin, wherein the MOFs comprise hexanuclear Zr/Hf oxyhydroxide clusters, and wherein each cluster is connected with 12 benzene-1,4-dicarboxylate ligands;
a package substrate coupled to the PCB, wherein the package substrate has a second CTE that is substantially equal to the first CTE; and
a die coupled to the package substrate.

21. The electronic system of claim 20, wherein a dielectric constant of the PCB in the terahertz range is approximately 3.5 or lower.

22. An electronic package, comprising:
a printed circuit board (PCB), wherein the dielectric constant of the PCB is approximately 2.0 or less, and wherein the PCB comprises:
a glass weave;
a resin; and
metal organic frameworks (MOFs) disposed within the resin;
a package substrate coupled to the PCB; and
a die coupled to the package substrate.

23. An electronic package, comprising:
a printed circuit board (PCB), wherein a coefficient of thermal expansion (CTE) of the PCB is less than approximately 13.0 ppm/° C., and wherein the PCB comprises:
a glass weave;
a resin; and
metal organic frameworks (MOFs) disposed within the resin;
a package substrate coupled to the PCB; and
a die coupled to the package substrate.

24. The electronic package of claim 23, wherein the CTE of the PCB is approximately 10 ppm/° C. or less.

25. An electronic package, comprising:
a printed circuit board (PCB), wherein a CTE of the PCB is less than approximately 13.0 ppm/° C., wherein the dielectric constant of the PCB is approximately 3.5 or less, and wherein the PCB comprises:
a glass weave;
a resin; and
metal organic frameworks (MOFs) disposed within the resin;
a package substrate coupled to the PCB; and
a die coupled to the package substrate.

26. The electronic package of claim 25, wherein the dielectric constant is measured at a frequency region in the terahertz range.

27. An electronic package, comprising:
a printed circuit board (PCB), wherein the PCB comprises:
a glass weave;
a resin; and
metal organic frameworks (MOFs) disposed within the resin, wherein a volume percentage of the MOFs in the PCB is approximately 60% or less;
a package substrate coupled to the PCB; and
a die coupled to the package substrate.

28. The electronic package of claim 27, wherein the volume percentage of the MOFs in the PCB is approximately 30% or less.

29. An electronic package, comprising:
a printed circuit board (PCB), wherein the PCB comprises:
a glass weave;
a resin; and
metal organic frameworks (MOFs) disposed within the resin, wherein the MOFs are zeolitic imidazole frameworks (ZIFs);
a package substrate coupled to the PCB; and
a die coupled to the package substrate.

30. An electronic package, comprising:
a printed circuit board (PCB), wherein the PCB comprises:
a glass weave;
a resin; and
metal organic frameworks (MOFs) disposed within the resin;
a package substrate coupled to the PCB, wherein a CTE of PCB is substantially equal to the CTE of the package substrate; and
a die coupled to the package substrate.

31. An electronic package, comprising:
a printed circuit board (PCB), wherein the PCB comprises:
a glass weave;
a resin; and
metal organic frameworks (MOFs) disposed within the resin, wherein a decomposition temperature of the MOFs is at approximately 450° C. or higher;
a package substrate coupled to the PCB; and
a die coupled to the package substrate.

32. An electronic package, comprising:
a printed circuit board (PCB), wherein the PCB comprises:
a glass weave;
a resin; and
metal organic frameworks (MOFs) disposed within the resin, wherein a moisture uptake of the MOFs is approximately 1.0 weight % or lower;
a package substrate coupled to the PCB; and
a die coupled to the package substrate.

* * * * *